US009620596B2

(12) United States Patent
Morales et al.

(10) Patent No.: US 9,620,596 B2
(45) Date of Patent: Apr. 11, 2017

(54) METHOD TO FABRICATE MICRO AND NANO DIAMOND DEVICES

(71) Applicant: Sandia Corporation, Albuquerque, NM (US)

(72) Inventors: Alfredo M. Morales, Livermore, CA (US); Richard J. Anderson, Oakland, CA (US); Nancy Y. C. Yang, Lafayette, CA (US); Jack L. Skinner, Butte, MT (US); Michael J. Rye, Los Lunas, NM (US)

(73) Assignee: Sandia Corporation, Albuquerque, NM (US)

( * ) Notice: Subject to any disclaimer, the term of this patent is extended or adjusted under 35 U.S.C. 154(b) by 64 days.

(21) Appl. No.: 14/490,518

(22) Filed: Sep. 18, 2014

(65) Prior Publication Data

US 2015/0041810 A1 Feb. 12, 2015

Related U.S. Application Data

(62) Division of application No. 13/598,152, filed on Aug. 29, 2012, now Pat. No. 8,852,998.

(Continued)

(51) Int. Cl.
*H01L 29/16* (2006.01)
*H01L 29/04* (2006.01)
(Continued)

(52) U.S. Cl.
CPC ........ *H01L 29/1602* (2013.01); *H01L 21/042* (2013.01); *H01L 21/044* (2013.01);
(Continued)

(58) Field of Classification Search
CPC ............... H01L 29/0673; H01L 29/068; H01L 29/0665; H01L 29/0669; H01L 51/0048;
(Continued)

(56) References Cited

U.S. PATENT DOCUMENTS 5,036,373 A * 7/1991 Yamazaki ............. C23C 16/274
257/103
5,420,443 A * 5/1995 Dreifus ................... C23C 16/02
257/289

(Continued)

OTHER PUBLICATIONS

Chan, C.K., et al., "High performance lithium battery anodes using silicon nanowires," Nature Nanotech. 3, 31-35 (2008).

(Continued)

*Primary Examiner* — Matthew Reames
*Assistant Examiner* — John Bodnar
(74) *Attorney, Agent, or Firm* — Blakely, Sokoloff, Taylor & Zafman, LLP

(57) ABSTRACT

A method including forming a diamond material on the surface of a substrate; forming a first contact and a separate second contact; and patterning the diamond material to form a nanowire between the first contact and the second contact. An apparatus including a first contact and a separate second contact on a substrate; and a nanowire including a single crystalline or polycrystalline diamond material on the substrate and connected to each of the first contact and the second contact.

10 Claims, 6 Drawing Sheets

Related U.S. Application Data

(60) Provisional application No. 61/529,067, filed on Aug. 30, 2011.

(51) Int. Cl.
*H01L 29/06* (2006.01)
*H01L 29/66* (2006.01)
*H01L 29/775* (2006.01)
*H01L 21/04* (2006.01)

(52) U.S. Cl.
CPC .......... *H01L 29/04* (2013.01); *H01L 29/0673* (2013.01); *H01L 29/66037* (2013.01); *H01L 29/775* (2013.01)

(58) Field of Classification Search
CPC .......... H01L 21/02603; H01L 21/0405; H01L 29/1602; H01L 29/775; B82Y 30/00; B82Y 10/00; H01B 1/24; Y10S 977/762; Y10S 977/742
See application file for complete search history.

(56) References Cited

U.S. PATENT DOCUMENTS

| | | | |
|---|---|---|---|
| 5,633,513 A * | 5/1997 | Koyama | H01L 29/1602 257/410 |
| 5,670,788 A | 9/1997 | Geis | |
| 7,394,103 B2 | 7/2008 | Gerbi | |
| 7,476,895 B2 | 1/2009 | Namba et al. | |
| 2002/0011612 A1 * | 1/2002 | Hieda | H01L 21/823814 257/262 |
| 2004/0061178 A1 * | 4/2004 | Lin | H01L 29/1054 257/350 |
| 2005/0079659 A1 * | 4/2005 | Duan | B82Y 10/00 438/197 |
| 2005/0121706 A1 * | 6/2005 | Chen | B82Y 10/00 257/288 |
| 2005/0275010 A1 * | 12/2005 | Chen | B82Y 10/00 257/315 |
| 2006/0060864 A1 * | 3/2006 | Gerbi | H01L 21/0237 257/77 |
| 2011/0045660 A1 * | 2/2011 | Romano | B82Y 10/00 438/478 |
| 2013/0209683 A1 | 8/2013 | Xu | |

OTHER PUBLICATIONS

Elstner, M., et al., "Self-consistent-charge density-functional tight-binding method for simulations of complex materials properties," Phys. Rev. B 58, 7260-7268 (1998).

Heyd, J., et al., "Efficient hybrid density functional calculations in solids: assessment of the Heyd-Scuseria-Ernzerhof screened coulomb hybrid functional," J. Chem. Phys. 121, 1187-1192 (2004).

Hickey, D.P., et al., "Cross-sectional transmission electron microscopy method and studies," J. Vac. Sci. Technol. A 24, 1302-1307 (2006).

Stanishevsky, A., "Focused Ion Beam Patterning of Diamondlike Carbon Films", Diamond and Related Materials, vol. 8, pp. 1246-1250 (1999).

Motayed, A., et al., "Fabrication of GaN-based Nanoscale Device Structures Utilizing Focused Ion Beam Induced Pt Deposition", Journal of Applied Physics 100, pp. 024306-1-024306-8 (2006).

* cited by examiner

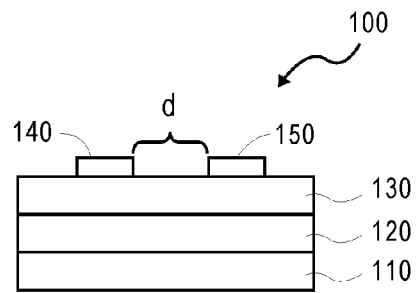
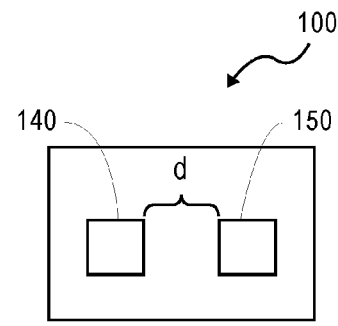
FIG. 1    FIG. 2
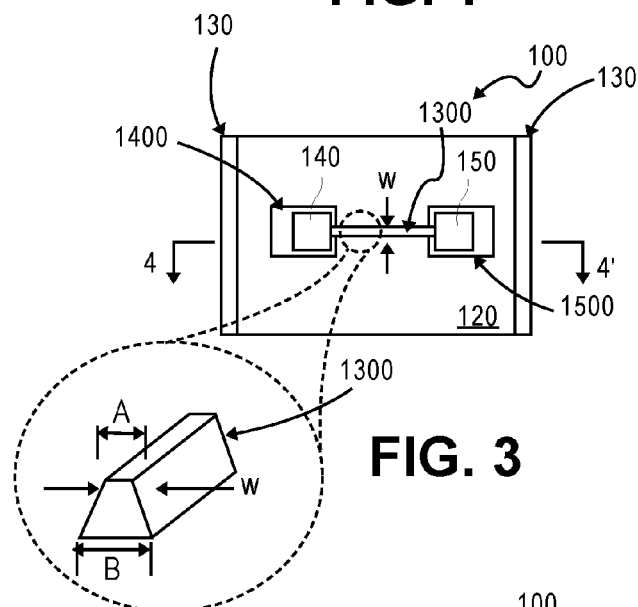
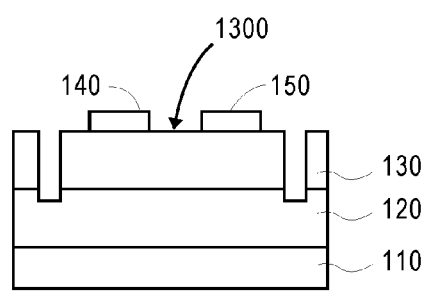
FIG. 3    FIG. 4
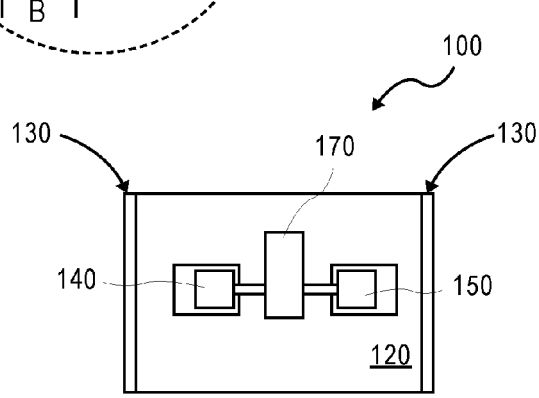
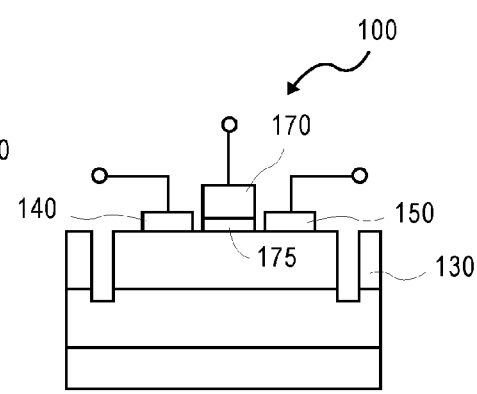
FIG. 5    FIG. 6

METHOD TO FABRICATE MICRO AND NANO DIAMOND DEVICES

CROSS-REFERENCE TO RELATED APPLICATION

This application is a divisional application of co-pending utility application U.S. patent application Ser. No. 13/598,152, filed Aug. 29, 2012, entitled "Method to Fabricate Micro and Nano Diamond Devices" which claims priority to and the benefit of the filing of U.S. Provisional Patent Application No. 61/529,067, filed Aug. 30, 2011. Both of the aforementioned applications are incorporated herein by reference.

STATEMENT OF GOVERNMENT RIGHTS

This invention was developed under Contract DE-AC04-94AL85000 between Sandia Corporation and the U.S. Department of Energy. The U.S. Government has certain rights in this invention.

FIELD

Nanowires.

BACKGROUND

The properties of bulk diamond such as its wide band gap, negative electron affinity, chemical and biological inertness, radiation hardness, and high thermal conductivity make it a promising material for applications in electronics, chemical/biological detection, and radiation monitoring. However, the realization of devices based on bulk diamond has been hampered by the inability to efficiently dope bulk diamond.

SUMMARY

A method of forming a diamond nanowire is disclosed. In one embodiment, the method includes forming a diamond material on a surface of a substrate and forming a first contact and a separate second contact. The diamond material is then patterned to form a nanowire between the first contact and the second contact.

In another embodiment, an apparatus is disclosed. The apparatus includes a first contact and a separate second contact on a substrate. A nanowire including single crystalline or poly-crystalline diamond material is disposed on the substrate and connected to each of the first contact and the second contact. A suitable apparatus according to the described embodiment may include a transistor.

BRIEF DESCRIPTION OF THE DRAWINGS

The claims may best be understood by referring to the following description and accompanying drawings that are used to illustrate embodiments of the invention. In the drawings:

FIG. 1 is a side view of an embodiment of a structure including a substrate having a dielectric layer and a layer of diamond material and two contacts formed on the layer of diamond material.

FIG. 2 shows a top view of the structure of FIG. 1.

FIG. 3 shows a top view of the structure of FIG. 1 following the formation of a nanowire between the contacts and connected thereto.

FIG. 4 shows the side view of the structure of FIG. 3.

FIG. 5 shows the structure of FIG. 3 following the formation of a gate electrode on the structure and the formation of an active transistor.

FIG. 6 shows a side view of the structure of FIG. 5.

DETAILED DESCRIPTION

Figure 7:
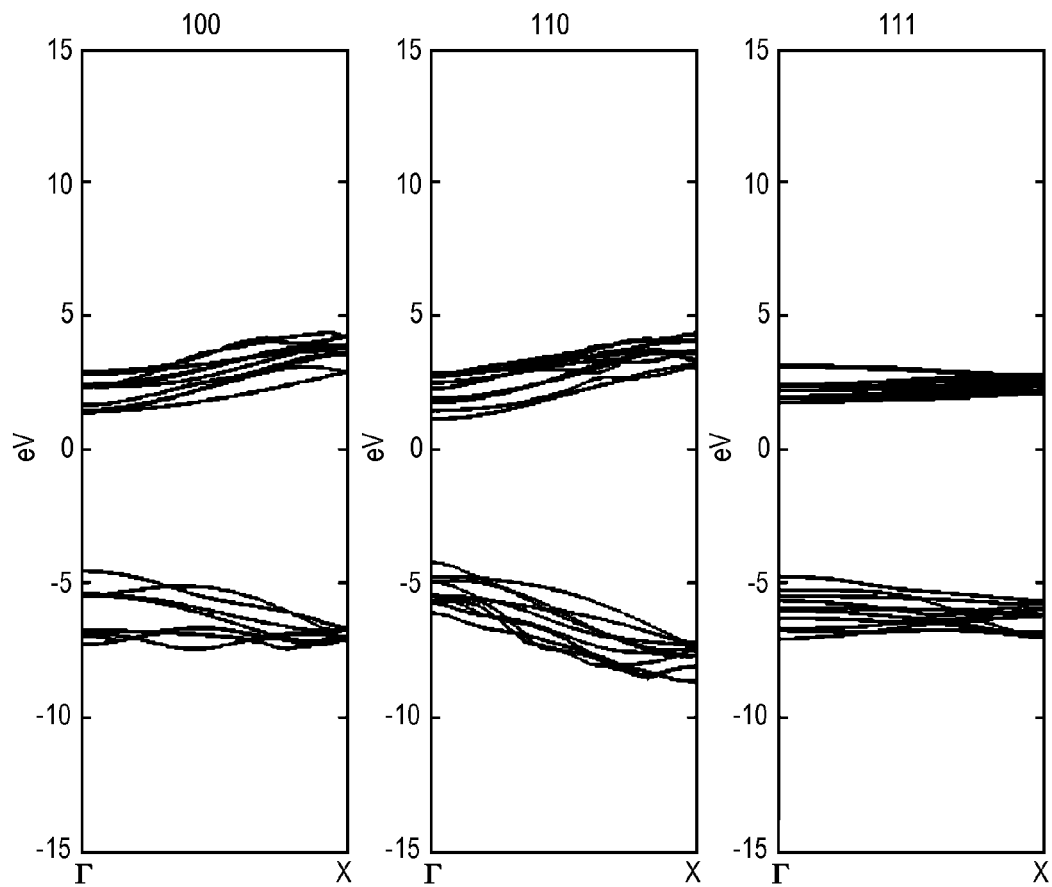
FIG. 7 shows valence and conduction bands for various diamond nanowire orientations computed with density functional theory using the HSE06 density functional theory method.

FIG. 1 shows a cross sectional side view of a portion of a structure. Structure 100 includes substrate 110 that, in one embodiment is a semiconductor substrate such as silicon (e.g., a portion of a silicon wafer). Overlying substrate 110 is layer 120 of a dielectric material such as silicon dioxide. A representative thickness of layer 120 is on the order of one micron. Overlying and on a surface of layer 120 is layer 130. In one embodiment, layer 130 is a single crystalline or poly-crystalline diamond material. A representative thickness of layer 130 is on the order of 200 to 500 nanometers thick. Representative introduction techniques for layer 130 of a single crystal or a poly-crystalline diamond material include, but are not limited to, growth techniques, such as heteroepitaxial growth.

Overlying and on a surface of layer 130 (a top surface as viewed) are first contact 140 and second contact 150. In one embodiment, first contact 140 and second contact 150 are each a similar material, such as platinum. One technique for introducing platinum contacts is through an ion beam induced deposition process. As viewed in FIG. 1, second contact 150 is separated from first contact by distance, d. In one embodiment, a representative distance is on the order of 1 to 10 microns. It is appreciated that distance, d, will depend, in part on the application for which the nanowire is to be utilized.

FIG. 2 shows a top view of the structure of FIG. 1. FIG. 2 shows first contact 140 and second contact 150 patterned as rectangles overlying layer 130. It is appreciated that such contact may have various shapes depending on the introduction technique and the desired device dimensions.

FIG. 3 shows a top view of the structure of FIG. 1 following a patterning of layer 130 to form a nanowire between first contact 140 and second contact 150. In one embodiment, nanowire 1300 is formed by an etching process by etching layer 130 with a focused ion beam (FIB). In one embodiment, a first FIB etch defines a wide wire between first contact 140 and second contact 150. The rough FIB etch also defines contact pad 1400 and contact pad 1500 that are each larger than first contact 140 and second contact 150 (e.g., twice as large as the original deposits). In a subsequent fine etch, a width, W, of nanowire 1300 is reduced. In one embodiment, nanowire 1300 has a patterned width, W on the order of 400 nanometers or less. A representative range is in the order of 100-400 nanometers. An inset of FIG. 3 shows an exploded isolated top perspective view of a portion of nanowire 1300. In one embodiment, patterning nanowire 1300 results in a nanowire having a trapezoidal shape with a width dimension, A, at one side (a top side as viewed) that is different than a width dimension, B, at a second side (a bottom side as viewed). In one embodiment, width, W, of 100-400 nanometers is an average width. It is appreciated, that in addition to a trapezoidal shape, other shapes (e.g., rectangular) are contemplated and may be dictated, at least in part, by the tooling or a specification.

FIG. 4 shows a cross-sectional side view of the structure of FIG. 3 through line 4-4'. FIG. 4 shows the isolated diamond material of layer 130 disposed under first contact 140 and second contact 150 and including nanowire 1300.

FIG. 5 shows the structure of FIG. 3 following the patterning of a gate electrode on the structure. As shown in FIG. 5, gate electrode 170 is patterned on layer 130 (on a surface of layer 130). In one embodiment, gate electrode 170 overlies a portion of nanowire 1300, including an entire portion between first contact 140 and second contact 150. Gate electrode is representatively a metal material such as platinum. FIG. 6 shows a cross-sectional side view of the structure of FIG. 5 through line 6-6'. In one embodiment, gate electrode 170 is separated from layer 130 by dielectric layer 175 which may be, for example, silicon dioxide or another dielectric (e.g., a high dielectric constant dielectric material). FIG. 6 shows that electric connections to gate electrode 170, first contact 140 and second contact 150 may be introduced to form an active transistor structure. Such a transistor structure may be appropriately doped as desired as one-dimensional nanowires are receptive to dopants (e.g., boron doping for a p-type transistor and nitrogen doping for an n-type transistor.

Example 1

The electronic properties of sub-10 nm diamond nanowires were investigated using density functional theory (DFT) and also as a function of nanowire diameter and orientation. Three different orientations were considered with the principal axis along the 100, 110, and 111 directions. All of the nanowires were fully hydrogenated on their surface and were structurally relaxed before a final calculation of electronic properties.

Figure 8:
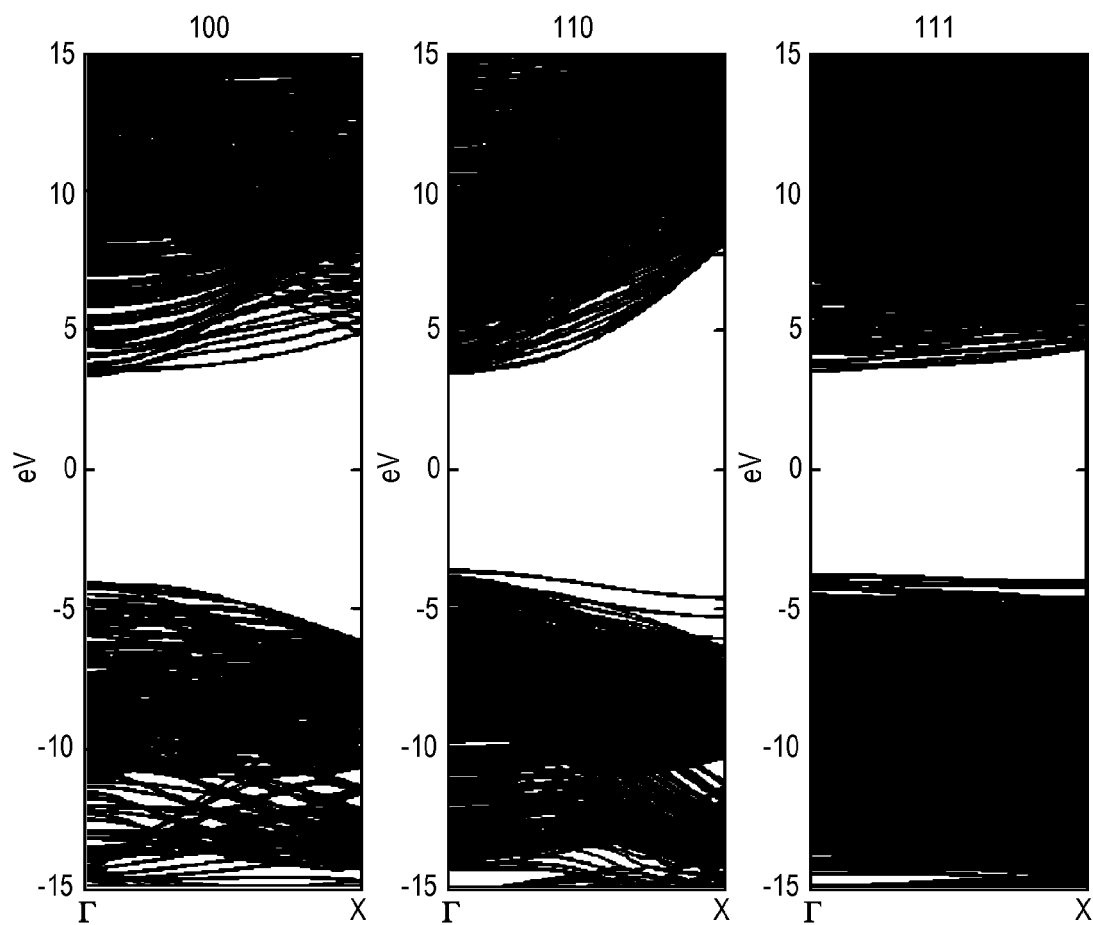
FIG. 8 shows valence and conduction bands for various diamond nanowire orientations computed with density functional theory using the SCC-TB formalism.

In all of the sub-10 nm nanowire density functional theory ("DFT") calculations, all of the orientations yielded large band-gap semiconductors and had direct band gaps (in contrast to bulk diamond which has an indirect band gap). Results obtained from full DFT calculations [J Heyd 2004] (FIG. 7), were also used to benchmark more computationally-efficient methods such as the self-consistent tight-binding (SCC-TB) [M Elstner 1998] approach (FIG. 8). In FIGS. 7 and 8, the valence bands have electron energies less than zero electron volts while the conduction bands have electron energies greater than zero electron volts.

The above referenced modeling demonstrates that in nanowires, diamond becomes a direct band gap material and that makes for a more efficient transition of electrons from a valance to a conduction band. The modeling indicates new electronic and sensing properties may be displayed by diamond nanowire devices.

Example 2

Two different types of thin diamond films were patterned into nanowire devices. One type was a polycrystalline boron doped diamond film (hereinafter referred to as PC) marketed under the name UNC Lightning purchased from Advanced Diamond Technologies (Romeoville, Ill., www.thindiamond.com). This sample was grown on top of a one micron thick silicon oxide film which rested on top of a standard grade silicon wafer. The other type was a single crystal diamond provided by Prof. Brage Golding from the Physics and Astronomy department at Michigan State University. This sample was grown via heteroepitaxial growth. In this technique, a [001] iridium single crystal film (about 300 nm) was first deposited on [001] strontium titanate. Growth of [001] diamond was then carried out via biased nucleation resulting in a uniform single crystalline diamond layer a few hundred nanometer thick.

The diamond nanowire devices were patterned using an FEI Helios 600 focused ion beam instrument equipped with a proprietary organometallic platinum source. The patterning started with the deposition of two platinum contact pads. Then a rough FIB etch defined a wide wire between the contact pads. This rough FIB etch defined a contact pad at each end of the wide wire and these pads were roughly twice as large as the original platinum deposits, thus providing the option to electrically contact the device through bare diamond as well as through the platinum metal. The wide wire was further narrowed down with a final FIB etch resulting in a 10.37 microns long nanowire with trapezoidal cross section. The FIB etches were performed in such a way that one micron of nanowire at each end is covered with platinum metal. In the case of the PC device, the platinum at each end of the wire minimizes current transport in the diamond contact pads.

The FIB instrument was used to generate electron thin samples [DP Hickey 2006] that were analyzed using a CM 30 TEM. Elemental composition of the original diamond films and of FIB etched samples was measured using Time-Of-Flight Secondary Ion Mass Spectrometry (TOF-SIMS manufactured by IONTOF, Munster, Germany) and X-ray Photoelectron Spectroscopy (XPS manufactured by KRATOS, Manchester, UK).

Phase purity was investigated by powder x-ray diffraction and by Raman spectroscopy. The Raman instrument is a custom microprobe based on a Carl Zeiss microscope with infinity-corrected optics coupled to a triple grating Acton Research spectrograph and a cryo-cooled CCD array detector. The instrument can be operated with or without confocal spatial filtering. The 0.40 numerical aperture objective used for these experiments, with the 532 nm excitation laser, enables approximately 1 micron spatial resolution at the sample. The spectral resolution using the 600 line-per-millimeter grating is less than 5 $cm^{-1}$.

Transport measurements were carried out in a Model 6000 Micromanipulator and Microscope Station equipped with two Model 525 probes (Micromanipulator Co., Carson City, Nev.) equipped with tungsten probes approximately 10 microns in radius at the tip. A 25×0.31 Bausch and Lomb lens was used to observe the devices. A Model 31-35-40 Bausch and Lomb illuminator was used to test the response of the devices to broad spectrum light (Bausch and Lomb, Rochester, N.Y.). A Keithley 237 Power Supply (Keithley Instruments, Cleveland, Ohio) was used to bias the source and drain contacts and another Keithley 237 Power Supply was used to attempt to gate the devices by either biasing the surrounding diamond (both device types) or by biasing the silicon substrate (PC type). Data were collected with a LabView program (NI, Austin, Tex.) through a GPIB to USB adapter.

TOF-SIMS and XPS confirmed the presence of boron in the PC diamond and show no other impurity atoms in either sample at the 0.1% level. TEM was used to investigate the microstructural composition of both types of sample [DP Hickey 2006]. The procedure used to fabricate the TEM sample is similar to the procedure used to fabricate the nanowire devices except that no contact pads were fabricated at either end, and platinum metal was deposited on top of the TEM sample to protect it during transfer onto the TEM grid.

The actual thickness of the PC and SC diamond nanowires was determined from TEM images. The patterned trapezoid nanowire dimensions are shown in Table 1 (using FIG. 3 for dimension identifiers).

TABLE 1

| | Nanowire Dimensions (nm) | | | |
|---|---|---|---|---|
| | A | B | T | L |
| PC | 118 | 188 | 410 | 8370 |
| SC | 175-180 | ~315 | 305 | 8370 |

The nanocrystalline nature of the PC diamond film was confirmed by TEM while TEM examination of the SC diamond film revealed stress bands in the material. Additionally, the PC diamond film appears to contain numerous pores as evidenced by high magnification TEM. If chemical or biological molecules were attached to the surface of such pores, chemical or biological sensors may be possible with this material.

Figure 9A:
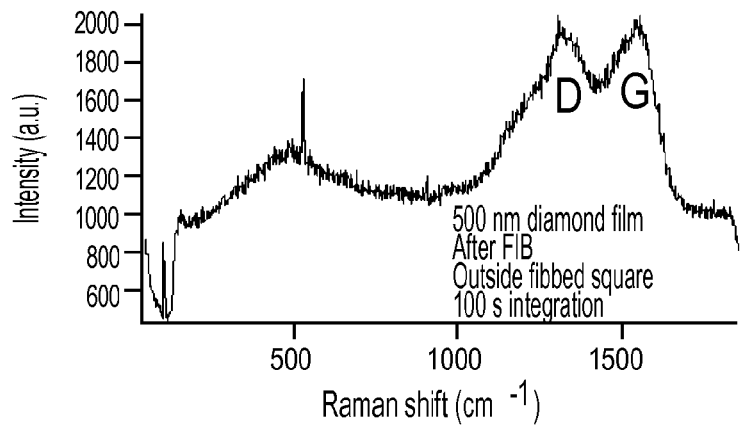
FIG. 9A shows a Raman spectrum taken from an area on a polycrystalline diamond film a distance from a patterned nanowire.
Figure 9B:
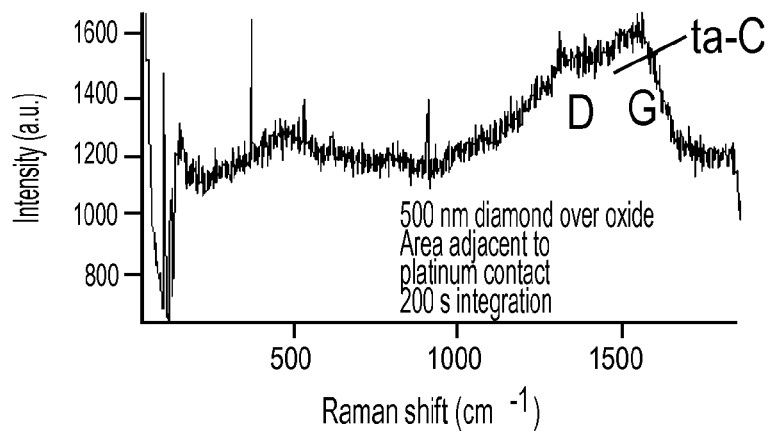
FIG. 9B shows a Raman spectrum taken from an area on a polycrystalline diamond film adjacent a contact.
Figure 9C:
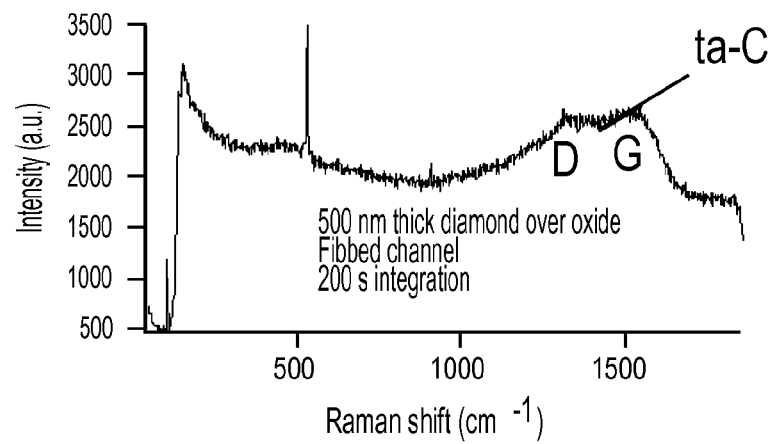
FIG. 9C shows a Raman spectrum taken from an area on a polycrystalline diamond film in the middle of a nanowire.

Theta-2theta x-ray diffraction spectra taken on the PC diamond sample only showed the presence of the diamond phase. FIGS. 9A-9C show Raman spectra taken from different areas on the PC diamond film. Spectra taken from as-received material or from areas far away from the FIB fabricated nanowire device (FIG. 9A) indicate the presence of some disordered graphite (D) and some $sp^2$ chains (G). Raman spectra taken near the patterned areas (i.e., areas that were imaged with the FIB but not etched) and spectra of the nanowire (FIGS. 9B-9C) indicated the presence of tetrahedral amorphous $sp^3$ carbon (ta-C). Because of the Raman selection rules, Raman spectroscopy is orders of magnitude more sensitive to these non-diamond phases and by no means do the Raman results indicate a major fraction of non-diamond phases. The Raman results indicate that FIB etching and imaging are probably creating tetrahedral amorphous $sp^3$ carbon.

Thus, in spite of the pronounced structural differences in the two types of diamond films used in this study, the FIB patterning technique successfully produced nanowire devices from both types of diamonds.

Figure 10A:
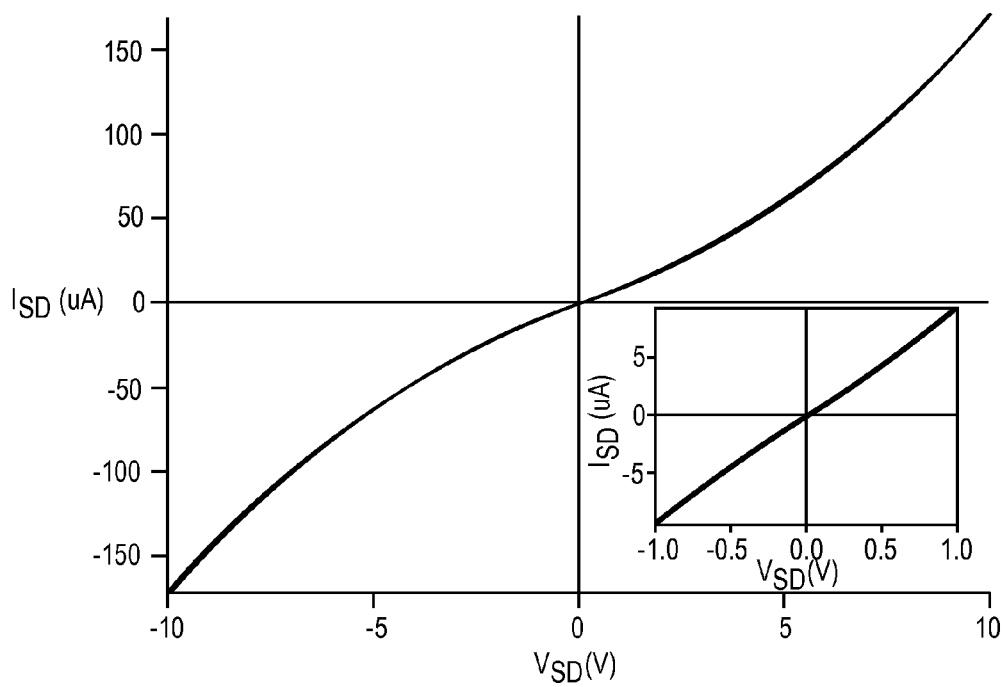
FIG. 10A shows a current versus voltage curve for a polycrystalline diamond nanowire device.
Figure 10B:
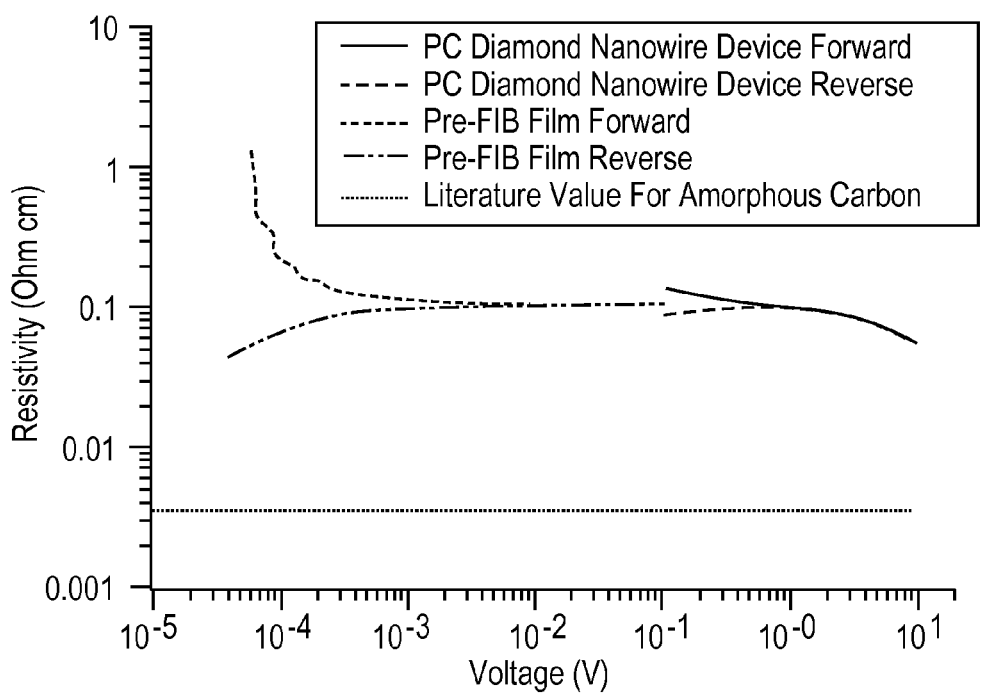
FIG. 10B shows resistivity versus voltage curves for a polycrystalline diamond nanowire device and for reference materials.
Figure 10C:
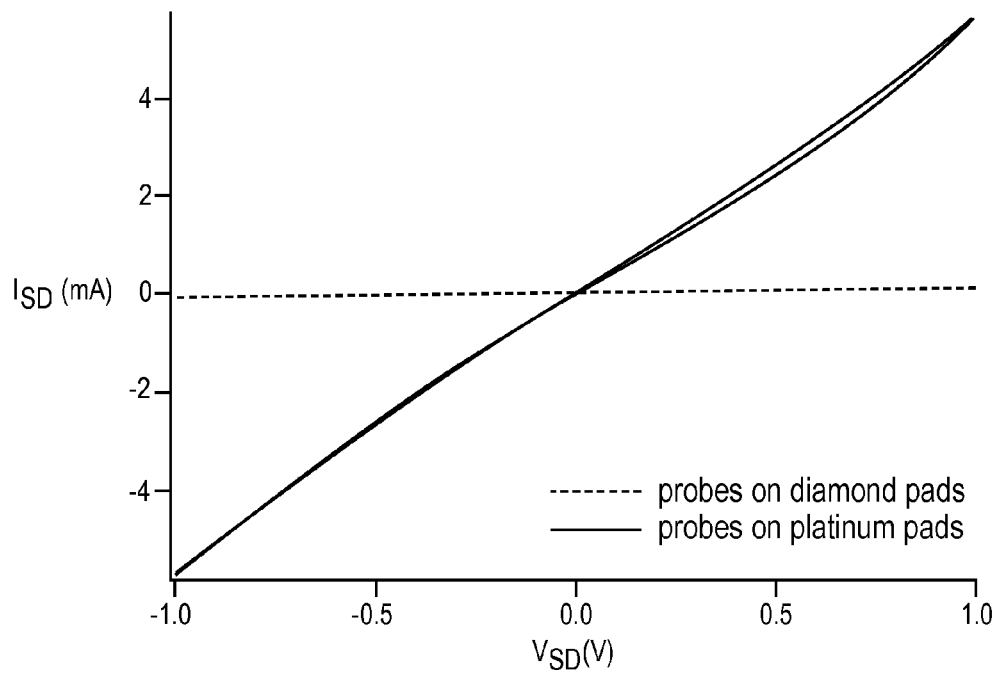
FIG. 10C shows current versus voltage curves for a polycrystalline diamond nanowire device contacted through platinum pads and contacted through the bare diamond surface.
Figure 10D:
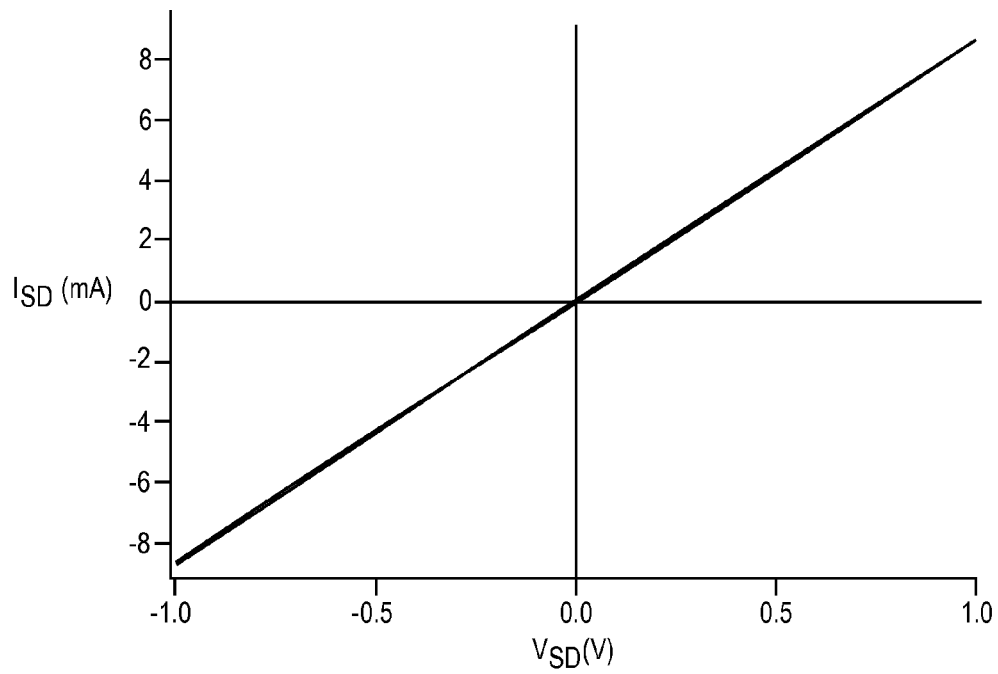
FIG. 10D shows a current versus voltage curve for a single crystal diamond nanowire device.

FIGS. 10A, 10C and 10D shows current vs. voltage (IV) curves collected from the PC and the SC diamond nanowire devices. FIG. 10B shows resistivity versus voltage curves for a diamond PC nanowire device and for reference materials. FIG. 10A shows the source to drain current as a function of the source to drain voltage for the PC diamond nanowire device. At higher voltages, the IV curve deviates from linearity while at lower voltage it appears linear (FIG. 10B inset). FIG. 10B shows the resistivity of the PC diamond nanowire device as a function of source to drain voltage. The plot shows the resistivity vs. voltage for the unpatterned PC diamond film and for amorphous carbon. The resistivity of the nanowire devices is similar to that of the unpatterned film and higher than that of amorphous carbon. This indicates that the beam-induced non-diamond phases in the device are probably not altering (e.g., increasing) the electrical conductivity of the nanowire device.

FIG. 10C shows the IV trace for a PC diamond nanowire device contacted via the Pt contact pads and via the bare diamond surfaces. The same tungsten tips were used for both experiments. The current flowing across the Pt contacts is roughly 50 times larger than that flowing across the tungsten-bare diamond interface indicating that platinum with an electron affinity of 205.3 kJ mol$^{-1}$ makes a more ohmic contact than tungsten with an electron affinity of 78.6 kJ mol$^{-1}$.

FIG. 10D shows the IV trace for the SC diamond device. Limited transport work was done on this sample as the iridium metal was still present underneath the nanowire section. Both types of devices lacked an appropriately configured gate electrode.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated in the figure to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description, various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. An apparatus comprising:
   a first contact and a separate second contact on a substrate; and
   a nanowire disposed between a first contact pad and a second contact pad, the nanowire and the first contact pad and the second contact pad comprising a single crystalline or polycrystalline diamond material patterned from a layer of the diamond material on the substrate, wherein the first contact is disposed on the first contact pad and the second contact is disposed on the second contact pad, wherein the nanowire comprises a trapezoidal shape.

2. The apparatus of claim 1, wherein a diameter of the nanowire is 400 nanometers or less.

3. The apparatus of claim 1, wherein the first contact and the second contact are disposed on diamond material.

4. The apparatus of claim 1, wherein the nanowire is connected to the diamond material on which the first contact and the second contact are disposed.

5. The apparatus of claim 1, wherein the substrate comprises a semiconductor material.

6. The apparatus of claim 1, wherein the substrate comprises a dielectric material.

7. The apparatus of claim 1, wherein the first contact and the second contact are each disposed on contact pads patterned from the layer of the diamond material.

8. The apparatus of claim 1, wherein the nanowire comprises polycrystalline diamond material.

9. The apparatus of claim 1 further comprising a gate electrode disposed on the nanowire.

10. The apparatus of claim 1, wherein the first contact pad and the second contact pad is each larger than the respective first contact and the second contact.

* * * * *